United States Patent [19]

Cservak et al.

[11] Patent Number: 4,665,007
[45] Date of Patent: May 12, 1987

[54] PLANARIZATION PROCESS FOR ORGANIC FILLING OF DEEP TRENCHES

[75] Inventors: Nancy R. Cservak, Wappingers Falls; Susan K. Fribley, Beacon; George R. Goth; Mark A. Takacs, both of Poughkeepsie, all of N.Y.

[73] Assignee: International Business Machines Corporation, Armonk, N.Y.

[21] Appl. No.: 766,629

[22] Filed: Aug. 19, 1985

[51] Int. Cl.$^4$ .............................................. G03C 5/00
[52] U.S. Cl. .................................... 430/311; 430/313; 430/317; 430/323; 430/330; 156/643; 156/668
[58] Field of Search ............... 430/313, 314, 315, 316, 430/317, 311, 328, 330, 323; 156/643, 668

[56] References Cited

U.S. PATENT DOCUMENTS

| | | | |
|---|---|---|---|
| 2,559,389 | 7/1951 | Beeber et al. | 41/43 |
| 3,976,524 | 8/1976 | Feng | 156/8 |
| 4,025,411 | 5/1977 | Hom-Ma et al. | 204/192 E |
| 4,076,860 | 2/1978 | Kuroda | 427/91 |
| 4,104,086 | 8/1978 | Bondur et al. | 148/1.5 |
| 4,139,442 | 2/1979 | Bondur et al. | 204/192 E |
| 4,284,659 | 8/1981 | Jaccodine et al. | 427/53.1 |
| 4,389,281 | 7/1983 | Anantha et al. | 156/646 |
| 4,404,735 | 9/1983 | Sakurai | 29/576 W |
| 4,541,169 | 9/1985 | Bartush | 29/591 |
| 4,568,601 | 2/1986 | Araps et al. | 428/167 |

OTHER PUBLICATIONS

Thompson et al, *Introduction to Microlithography*, American Chemical Society, Washington, D.C. 1983.

"Dielectric Isolation Planarization", T. A. Bartush et al., IBM TDB, vol. 21, No. 5, Oct. 1978, pp.1868-1869.
"Forming wide Trench Dielectric Isolation", P. J. Tsang, IBM TDB, vol. 25, No. 11B, Apr. 1983, pp. 6129-6130.
"Manufacture of Semiconductor IC", H. Harada, Japanese Publication No. 58-138049.

*Primary Examiner*—John E. Kittle
*Assistant Examiner*—José G. Dees
*Attorney, Agent, or Firm*—T. Rao Coca

[57] ABSTRACT

Disclosed is a process for planarization of semiconductor structures having dielectric isolation regions. Specifically, the process is directed to planarization of an organic polyimide layer obtained following filling of deep trenches in a semiconductor substrate having high and low density trench regions with this material. After over-filling the trenches with the polyimide and obtaining a non-planar polyimide layer having a thickness much larger in the low trench density regions than that in the high density regions, a photoresist layer is applied thereover. The photoresist is then controllably exposed using a mask which is the complement or inverse of the mask used for imaging the trench patterns to obtain a thick blockout photoresist mask over the trenches and a thin wetting layer of photoresist over the remainder of the substrate. Next, by means of a thermal step, the blockout photoresist is caused to reflow to form a relatively thick photoresist layer over the high trench density regions and a thin photoresist layer over the low trench density regions, thereby exactly compensating for the non-planarity of the polyimide layer.

10 Claims, 7 Drawing Figures

PLANARIZATION PROCESS FOR ORGANIC FILLING OF DEEP TRENCHES

BACKGROUND OF THE INVENTION

The invention relates to a method for planarization of semiconductor structures which have dielectric isolation regions. More particularly, the invention relates to a method for planarizing an organic polyimide layer during filling of deep trenches in a semiconductor substrate having low and high trench density regions with this material.

The present trend in semiconductor microelectronics technology is toward very large scale and ultra large scale integration (VLSI and ULSI, respectively) of microelectronic devices. Minimum device feature size approaching 1.0 μm is the near term goal in this technology. In the fabrication of such integrated circuits one of the most favorite dielectric isolation scheme by which one region of the semiconductor substrate containing an active and/or passive device is electrically isolated from another is the trench isolation. In an embodiment thereof, deep trenches are made in the substrate by reactive ion etching. The trenches are typically about 5–6 μm deep, about 2–3 μm wide and spaced about 2.5–3.5 μm apart from another trench. During the etching of the trenches, the remaining semiconductor substrate is protected by a protective layer, typically consisting of silicon dioxide-silicon nitride sandwich structure. Following the forming of the trenches, they are filled with a suitable material such as oxide, polysilicon or an organic polymeric material, for example, polyimide.

While the dielectric-filled trench isolation provides effective dieletric isolation between devices, the fundamental disadvantage of this scheme is that the resulting structure tends to be nonplanar. To elaborate on this, attention is focussed on the polyimide-filled trench isolation. In this process, after etching the trench in the semiconductor substrate polyimide is applied over the entire substrate followed by a baking step to cure and evaporate the solvents in the polyimide. During this baking step since the trench bed offers a significantly greater volume to be filled with the polyimide material than the remainder of the substrate, invariably a trough is formed over the trench region. In other words, a difference in polyimide planarization or a "planarization delta" occurs in the polyimide material overlying the trench region and the remainder of the substrate.

In addition to this lack of complete local planarization, the prior art polyimide-filled trench isolation also suffers from lack of global planarization (i.e., planarization across the entire chip or wafer). To expound on this, it is not uncommon for a VLSI or ULSI chip to consist of high device density regions corresponding to a memory section having a large number (10,000 or more) of active devices (e.g., transistors) coexisting with low device density regions corresponding to a logic section or a test device area, the latter, in general, being the kerf area of the semiconductor wafer from which the chips are diced. Since each of the devices is surrounded with trench isolation, there will exist on the chip both high trench density and low trench density regions. When such a structure is coated with polyimide material since the high trench density region offers a significantly larger volume to be filled by polyimide compared to the low trench density region, a profoundly nonplanar polyimide-coated structure will result. That is, the thickness of the polyimide layer formed in the low trench density region will be significantly higher than that in the high trench density region. This situation is illustrated in FIG. 1 wherein 10 designates a single semiconductor substrate, shown as a broken piece, consisting of the high and low trench density regions 12 and 14, respectively. Illustratively, region 12 contains a plurality of polyimide-filled trenches 16—16 and region 14 contains a single polyimide-filled trench 18. Δ in FIG. 1 designates the global planarization delta or the difference in thickness of the polyimide coatings 20 and 22 in the high and low trench density regions, respectively. Also shown in FIG. 1 is the local planarization delta designated by δ which was discussed hereinabove. While the actual values of Δ and δ are governed by such factors as the high/low trench density, and relative separation of the trenches, Δ and δ are typically in the ranges of approximately 1–2 μm and 0.2–0.4 μm, respectively.

The nonplanar polyimide-filled trench structures although provide an effective dielectric isolation between devices, pose a number disadvantages to subsequently forming single- or multi-level metallization to interconnect the various components of the integrated circuit. One disadvantage is that the uneven topology poses resolution problems in defining images thereon. Specifically, in the subtractive metallization process in which a blanket layer of metal is applied to the full surface of the substrate, followed by applying a photoresist layer to the resulting nonplanar metal surface and exposing to light for patterning the resist, the resolution of the image in the high and low trench density regions will not be the same. Consequently, the metallization pattern obtained by etching the blanket metal layer using this resist pattern as a mask will not have the desired line width, line spacing, etc. over the entire pattern, thereby having a direct bearing on the yield and reliability of the electronic components thus produced. Similar problems occur with respect to the additive metallization or lift-off process which was described and claimed for the first time in U.S. Pat. No. 2,559,389.

Another disadvantage of the nonplanar surface is that when a metal layer is applied over this surface, the resultant layer becomes thinner in those portions in which the underlying polyimide layer has a sharp gradient. These thinned down portions result in current crowding and possible failure due to electromigration. Yet another disadvantage of the nonplanar surface, particularly in the context of multilevel metallization where one level of metallization is insulated from the other by means of an insulative layer such as polyimide or quartz, is electrical shorting between one metallization level and the next due to formation of a thinner insulative layer in the high trench density regions.

Thus, when continued miniaturization of integrated circuits and increasing density imposing severe requirements on the width and spacing of the metallization patterns, planarity of the surface upon which the metallization system can be established has become a basic necessity. It is, therefore, very important that the substrate containing dielectrically isolated devices be as planar as possible for the overlying single- and multi-level metal pattern structure. The device structure requirements of the present integrated circuits are such that global planarization must be achieved within ± 0.3 μm of the nominal fill level over all combinations of trench pattern factors.

Attempts have been made in the prior art to achieve planarization of a nonplanar surface. One such technique involves first etching the nonplanar polyimide-filled trench structure to reduce the thickness of the thicker polyimide layer in the low trench density region. Then, a series of steps including coating a thin layer of polyimide over the shallow surface regions followed by reflow, bake and etchback of the newly applied polyimide are accomplished. Next, these series of steps are repeated at least two times until the desired degree of planarization is obtained over the entire substrate. The basic drawback of this process is that it requires complex and multiple series of steps which are unsuitable for a high volume manufacturing environment particularly since the end results of the process are not satisfactory in terms of obtaining a totally planarized and defect-free structure.

"Dielectric Isolation planarization" by T. A. Bartush et al. IBM Technical Disclosure Bulletin, Vol. 21, No. 5, pp. 1868–1869, October 1978 discloses a method of planarizing an oxide-filled trench structure using photoresist masking step to selectively fill the pockets in the conformal oxide layer over the trenches. The photoresist is formed in the pockets by the block-off mask technique, followed by baking the resist to render it insoluble to a photoresist overcoat that is subsequently applied. By reactive ion etching the composite photoresist-oxide layers the structure is planarized.

"Forming Wide Trench Dielectric Isolation" by P. J. Tsang, IBM Technical Disclosure Bulletin Vol. 25, 11B, pp 6129–6130, April 1983 discloses a method in which both deep and narrow trenches are filled with oxide and planarized at the same time. In this method a hardened photoresist plug is provided in the trench pocket which is then used to facilitate the surface planarization somewhat analogous to the IBM TDB by Bartush et al.

U.S. Pat. No. 4,404,735 issued to J. Sakurai discloses a method of filling a trench in a silicon substrate by forming a glass or silicon layer followed by irradiating the layer with a laser beam to fluidify and flow into the trench gaps. Planar trench isolation so achieved in highly local but not global.

U.S. Pat. No. 4,389,281 issued to N. G. Anantha et al and assigned to the present assignee discloses a method for planarizing a non-uniform oxide formed over an oxide-filled trench. The oxide is removed by a planarizing resist-etching process so that etching in thicker resist areas proceeds at a rate slower than etching in thinner resist areas. In other words, planarization is achieved by taking advantage of the etch rate differences of materials.

U.S. Pat. No. 4,025,411 issued to Y. Hom-Ma et al discloses a plarization technique where a substrate is covered with a material having an etch rate approximately the same as that of the material which is to be etched, whereafter physical etching such as RF sputtering is conducted until the desired substrate is etched.

U.S. Pat. No. 4,073,054 issued to T. Kaji et al discloses a method similar to Hom-Ma et al discussed above except that two dielectric materials (oxide and polyimide) are used, the second dielectric material having the same etch rate as the first. The two dielectrics are then etched to form a locally planar surface.

U.S. Pat. No. 4,284,659 issued to J. Jaccodine et al discloses forming an interlevel glass layer having feedthrough apertures on a partially completed semiconductor device. By means of CW laser the glass is caused to reflow and form a smooth topography about the apertures. Global planarization cannot be achieved by this process since the viscosity of the glass is rather too high to enable it to flow across the dimensions of the chip.

Japanese publication No. 58-138059 by H. Harada discloses filling a silicon trench with polyimide. Local trench-fill planarization is achieved by etching off excess polyimide.

U.S. Pat. No. 4,076,860 issued to H. Kuroda discloses a planarization technique involving the use of two photoresist layers in the context of forming electrode wirings in semiconductor devices. In this technique a combination of photolithographic exposures and plasma etching is utilized to planarize.

Thus, the prior art basically addresses the local planarization problem. None of the solutions with respect to local planarization is extendable to achieve global planarization. To the extent the prior art attempted to solve the global planarization problem, the provided solutions invariably involve multiple masking, coating and etching processes which are not only cumbersome, but unsuitable for manufacturing environment due to the high cost and unreliability associated therewith.

Accordingly, it is an object of the invention to provide a simple, straight forward and reliable process which enables global planarization over an entire semiconductor chip or wafer.

It is another object of the invention to achieve global planarization within ±0.3 μm of the nominal fill regardless the nature of the polyimide-filled trench pattern.

The above ojects and other related objects and advantages may be achieved through the photoresist blockouts, block reflow and reflow enhancement via a wetting film of photoresist.

SUMMARY OF THE INVENTION

In accordance with the invention, a novel process for planarizing a dielectric or insulating material layer in conjunction with filling of deep trenches in a semiconductor with filling of deep trenches in a semiconductor substrate having high trench density and low trench density regions with this material. After over-filling the trenches with the dielectric material and obtaining a non-planar dielectric layer having a thickness much larger in the low trench density region than in the high trench density region in a conventional manner, a thick photosensitive layer is applied thereover. The photosensitive layer is controllably exposed using a mask which is the inverse or complement of the mask used for imaging the trench pattern on the substrate to obtain a thick blockout mask of the photosensitive material directly over the trenches and a thin wetting layer of this material over the remainder of the substrate. Next, by a thermal process the blockout photosensitive material, aided by the wetting layer, is caused to reflow in such a manner as to form relatively thick and thin layers of the photosensitive material over the low trench density and high trench density regions, respectively, thereby exactly compensating for the non-planarity of the dielectric layer.

By utilizing a dielectric trench-fill material which has the same etch rate as the blockout photosensitive material, the structure can be etched to obtain a globally planarized and dielectric-filled trench structure.

BRIEF DESCRIPTION OF THE DRAWINGS

The novel features, process steps and their combination characteristic of the invention is set forth in the appended claims. The invention itself, however, will be best understood by reference to the detailed description which follows in conjunction with the accompanying drawings, wherein:

DETAILED DESCRIPTION OF THE PREFERRED EMBODIMENT

Figure 1:
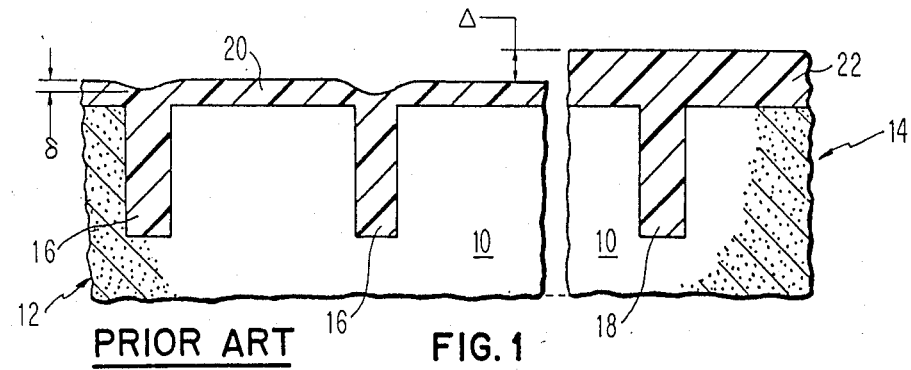
FIG. 1 shows a schematic cross-sectional view a dielectric-filled trench isolation structure obtained in accordance with the prior art.
Figure 2:
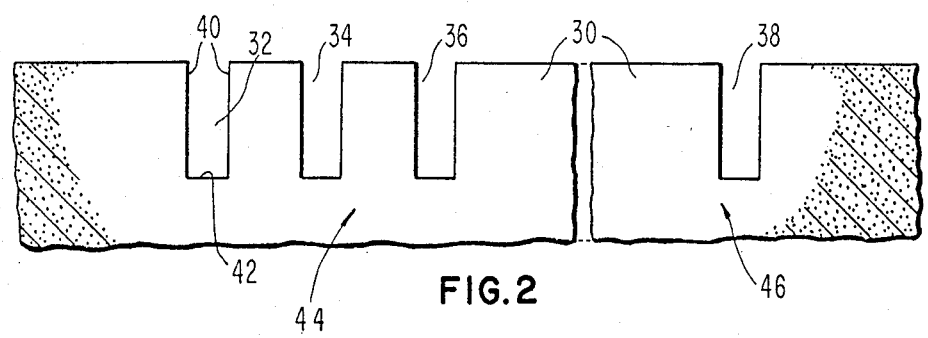
FIGS. 2-7 are flow diagrams illustrating by sequential cross-sectional representation one embodiment of the process of the present invention for forming a globally planarized dielectric trench isolation structure.

Referring now more particularly to FIGS. 2 through 7, the basic process steps for one basic form of the invention is described. FIG. 2 illustrates one small, greatly enlarged portion of a semiconductor body, for example, silicon which will be used to form a very dense VLSI or ULSI circuit. A monocrystalline silicon body 30 is provided and trenches 32-38 each having a substantially vertical surface 40 and a substantially horizontal surface 42 by selectively etching the silicon body 30. This selective etching to form the trenches 32-38 is well known (see for example, U.S. Pat. Nos. 4,104,086 and 4,139,442 both issued to J. A. Bondur et al and assigned to the present assignee, both of these patents are hereby incorporated by reference). It typically involves, after doping the surface regions of the silicon body 30 with appropriate dopant which is dictated by the nature of the integrated circuit to be fabricated thereon, a dielectric layer (of thickness of about 0.5 $\mu$m, not shown) such as silicon dioxide or a silicon dioxide-silicon nitride dual layer is formed on the surface of body 30. Then, a photoresist layer (of thickness of about 1 $\mu$m, not shown) is applied to the dielectric layer. The photoresist can be any suitable material which is capable of withstanding etching of the underlying dielectric layer. The photoresist is then masked with a conventional mask (not shown) and exposed to a suitable radiation, such as ultraviolet light, to provide exposed, polymerized, etchable portions and unexposed, unpolymerized, unetchable portions. The etchable portions of the resist are then removed with a conventional liquid developer. Thereafter, the underlying dielectric layer which is exposed after removal of the etchable photoresist portions is etched off by reactive ion etching (RIE), for example, by using an RF voltage induced gaseous plasma formed in a low pressure ambient that at least includes a gas which dissociates to provide halogen ions or radical groups containing reactive halogen species, e.g., CF4. The RIE can be accomplished using the apparatus described in U.S. patent application Ser. No. 594,418 filed July 9, 1975, now abandoned, in the names of J. M. Harvilchuck and assigned to the present assignee. Next, the remaining photoresist is removed and using the apertured dielectric layer as a mask the exposed silicon body 30 is etched by RIE, for example, at an RF power level of 0.16 watts/sq.cm. with 3.5% Cl$_2$/Ar gas mixture at a total pressure of 10 $\mu$m. The etching penetrates the silicon body 30 much more rapidly than in the case of the dielectric layer, resulting in deep and well-defined trenches 32-38. The depth and width of the trenches are typically in the ranges of 4-6 $\mu$m and 2-3 $\mu$m, respectively.

The silicon body 30 includes a high trench density region designated by the numeral 44 consisting of a plurality of trenches 32-36 and a low trench density region 46 consisting of a single trench 38. The body is shown in broken representation for convenience of illustration to emphasize that the relative physical separation of the high trench density region 44 and the low trench density region 46 is too significant to truly depict by means of an unbroken silicon body.

The high trench density region 44 shown in FIG. 2 typically corresponds to the region of the silicon body where a transistor chain will be formed consisting of a large number of transistors in close proximity to each other. The low trench density region 46 typically corresponds to the region of the silicon body 30, such as the kerf region, where a single isolated device, such as a test device to monitor the fabrication of the integrated circuit, will be located. The relative spacing of the trenches 32-36 in the high trench density region will typically be in the range of 2-3 $\mu$m.

Figure 3:
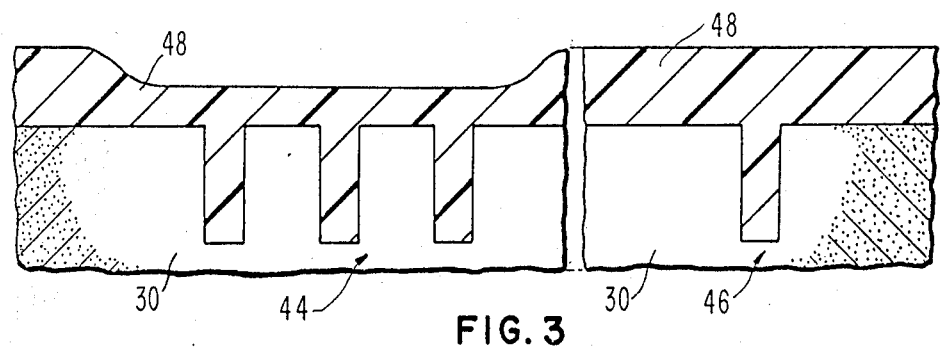

Progressing toward the structure shown in FIG. 3, next the remnant dielectric mask (not shown) over the silicon body 30 is removed and the trenches 32-38 are filled with an organic polymeric material. An example of the polymeric trench fill material is polyimide available commercially under the tradename of Thermid IP-600 from National Starch and Chemical Company. To fill the trenches, the organic polyimide is applied to the surface of the silicon body 30 such that an essentially uniform 2-3 $\mu$m thick layer of this material is initially formed. The structure is then subjected to a low temperature baking step at approximately 150°-200° C. to cause the polyimide to flow into and completely fill the trenches 32-38 and to drive off excess solvent. Then, baking at a slightly higher temperature in the range 225°-275° C. is accomplished to crosslink and rigidize the polyimide. The structure resulting from these series of process steps is as shown in FIG. 3 where 48 designates the polyimide fill. As previously discussed, since the high trench density region 44 offers a significantly larger volume to be filled by the polyimide compared to that by the low trench density region 46, a nonplanar polyimide-filled trench structure will result. The thickness of the polyimide layer corresponding to the region 44 will be considerably smaller than that overlying the region 46. The difference in these thickness is a function of the trench pattern in the silicon body 30, but typically is in the range of approximately 0.5-2 $\mu$m. For convenience and clarity of illustration, absence of local planarization, which becomes quite prominent particularly when the trench widths are large and trench spacings small, is not shown in FIG. 3.

Figure 4:
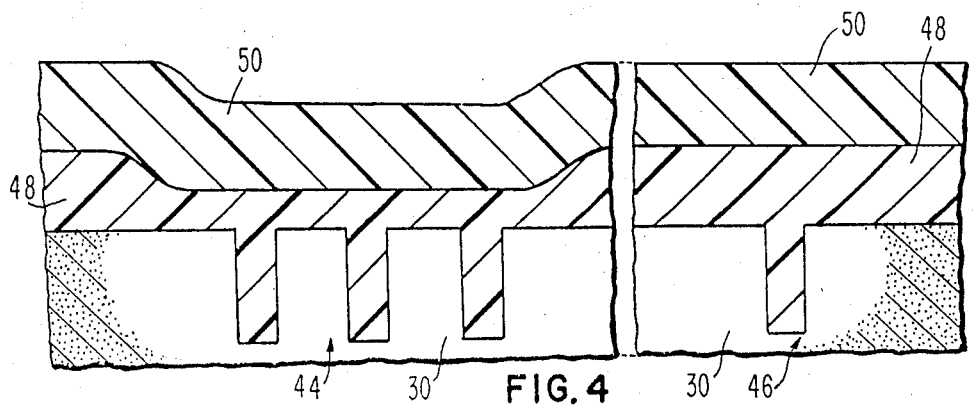

After obtaining the nonplanar polyimide-filled trench structure having a thin polyimide layer over the high trench density region and a thick polyimide layer over the low trench density region in this manner, referring to FIG. 4, a thick (3-5 $\mu$m thickness) conformal layer 50 of a high constant photosensitive material is applied to the polyimide surface. Another requirement of the photosensitive material is that it have the same etch rate (for wet or dry etching) as the polyimide. An example of the photosensitive material which ideally satisfies these requirements is the positive diazo ketone novolac photoresist. The photoresist is applied in the conventional manner by spin coating.

The next novel process step of the invention is to selectively expose the photoresist layer 50 using a mask which is the complement or inverse of the mask used for defining the trenches 32-38 discussed hereinabove in the context of FIG. 2 structure formation. In other words, the mask used for exposing the photoresist 50 would block the light from reaching the regions of the resist 50 which lie directly over each of the trenches 32-38 and transmit the light to expose all other regions of the resist 50. One example of light suitable for exposing the photoresist 50 is ultraviolet light of wavelength in the range 350-500 nm. In addition to exposing the resist 50 using a unique mask which is complementary to that used for defining the trenches, the exposure of this resist layer is accomplished in a controlled manner (by controlling the exposure tie and u.v. light intensity). This controlled exposure is accomplished in such a manner that the areas of the reist 50 which are not masked by the complementary mask are not fully developed, but retain a thin bottom layer (also termed wetting layer herein) designated by numeral 52 in FIG. 5. The thickness of the wetting layer 52 should be sufficient to enable the unexposed portions of the resist 50 to flow when subjected to a heating process as will be fully explained hereinbelow. For the specified thickness of the resist 50 and the density of the trenches in the high trench density region 44, the preferred thickness of the wetting layer 52 is in the range 0.1-0.5 $\mu m$.

The exposed portions of the resist 50 are then removed by contacting the structure with a conventional liquid developer for an appropriate period at room temperature and then washed with water.

In a specific example, for a conventional positive resist (such as AZ1350J, AZ being the trademark of American Hoeschst Corporation) layer 50 of an approximate thickness of 3 $\mu m$, a wetting layer 52 of thickness of about 0.5 $\mu m$ can be obtained by exposing the resist to u.v. light of wavelength 350-500 nm at a dose of 32 millijoules for a period of 35-50 seconds.

Figure 5:
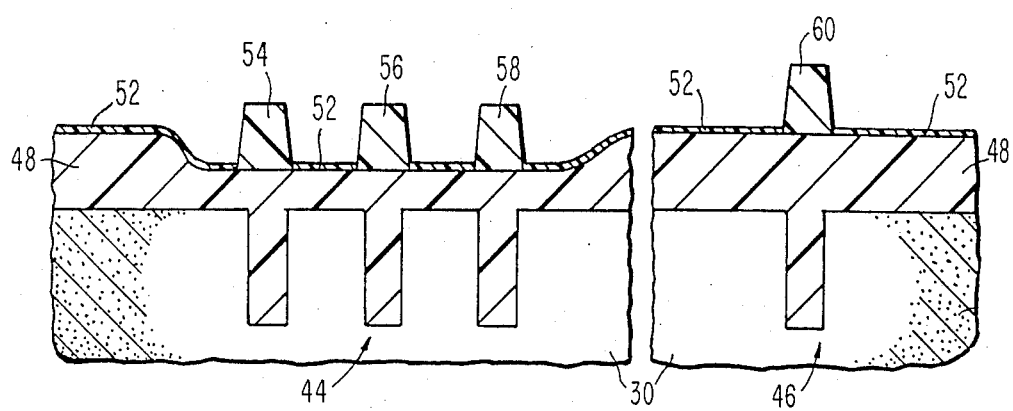

The areas of the photoresist layer 50 (FIG. 4) which are masked by the complementary mask retain in tact the entire thickness of the resist 50 forming a blockout photoresist mask consisting of sections 54, 56, 58 and 60 dirctly over the trenches 32, 34, 36 and 38, respectively as shown in FIG. 5. In other words, at the completion of the controlled exposure step, a blockout mask is formed over the polyimide-filled trenches and a thin continuous bottom film 52 of the resist 50 is maintained over the remainder of the polyimide layer 48.

Figure 6:
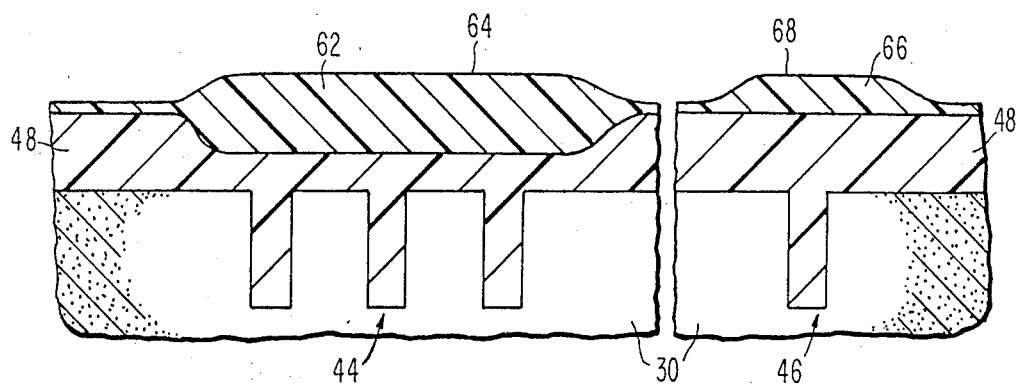

Next, referring to FIGS. 5 and 6, the structure is subjected to a heating step at a temperature in the range of about 200°-250° C. to cause the blockout mask sections 54-60 to reflow and flatten out by taking advantage of the presence of the thin wetting layer 52 which also turns viscous during this heating step. If the wetting layer 52 were absent, the photoresist corresponding to the blockout sections 54-60 will, upon heating, tend to merely dome up like a Gaussian dome. As a result of this heating step, the blockout mask sections 54, 56 and 58 shown in FIG. 5 will turn viscous, reflow and, aided by the wetting layer 52 in between these sections, will coalesce into a solid mass 62 having a substantially horizontal upper surface 64 and a thickness intermediate to the thickness of the wetting layer and that of the blockout mask sections from which it was derived. The single blockout mask 60 (FIG. 5) in the low trench density region 46 will likewise reflow aided by the wetting layer 52 adjacent thereto into the flattened mass 66 having a substantially horizontal top surface 68. The thickness of the reflowed resist 66 will be smaller than that of the reflowed resist 62 since the former is formed from a single blockout mask section 60 whereas the latter is the resultant of three blockout mask sections 54, 56 and 58. The net effect of these process steps is that the blockout mask sections in the high and low trench density regions, upon reflow, exactly compensate for the topographical variations in the thickness of the polyimide layer 48 by obtaining a composite polyimide-photoresist layer which has essentially an identical thickness in the high and low trench density regions.

Thus, the variation in the thickness of the dielectric trench fill material which is basically a direct artifact of the proximity of the trenches is exactly compensated by the invention by means of a tailor-made blockout photoresist mask formed directly over the trenches and a thin wetting photoresist layer formed everywhere else. The compensation for topographical variation is exact since the blockout mask sections are provided only over the trenches.

Figure 7:
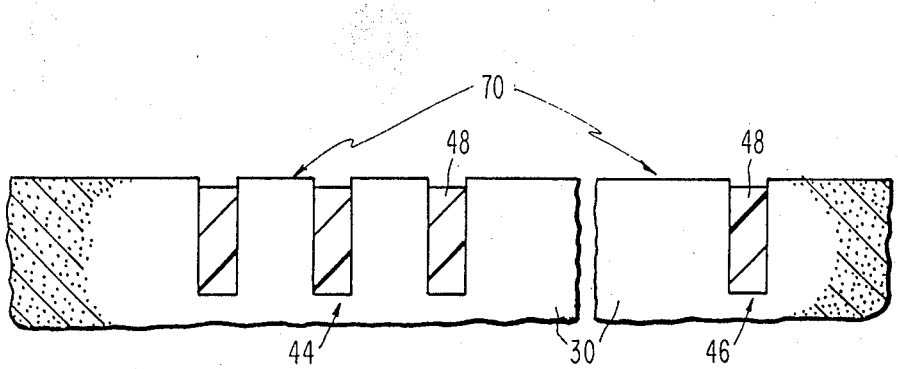

Progressing toward the final structure shown in FIG. 7, the structure of FIG. 6 is then subjected to an etching step, such as directional RIE using a parallel plate etching system of the type described in aforementioned application Ser. No. 594,418 and oxygen etch species. Laser interferometry can be used to monitor the end point of etching. Since the etch rates of both the polyimide layer 48 and the photoresist 62/64 are essentially the same and since the thickness of the polyimide-photoresist composite material over the high and low trench density regions are alike, a globally planarized polyimide-filled trench isolation structure shown in FIG. 7 is obtained. The upper surface plane of this globally planarized structure, designated by 70 in FIG. 7, is planar within 0.1-0.3 $\mu m$.

Thus, there has been provided, in accordance with the invention a novel process that fully satisfies the objects and advantages set forth above.

Although the process has been described with respect to narrow and deep U-shaped trenches, it is applicable to a variety of trench patterns including V-shaped trenches, wide and shallow trenches and any number of trenches. When the trench density is high, the thickness of the trench-fill material layer in that region will be low. However, the blockout mask material sections will correspondingly be more dense in this arrangement which, upon reflow, will appropriately compensate for the small thickness of the trench-fill material layer. When the trenches are spread out somewhat, the resulting trench-fill material layer will be thicker. However, in this case the blockout mask sections will be less dense which, upon reflow, will yield a thinner layer. It is emphasized that regardless of the nature and density of the trench pattern, a self-compensating effect is obtained by the present noncritical process.

Although the process has been discussed in terms of forming the wetting layer 52 (FIG. 5) from the blockout mask material, this is not an absolute requirement. The wetting layer can be formed from an alternative material which is compatible with the blockout mask material. In this alternative approach, a thin wetting layer of a first material, for example a novolac polymer resin, is formed by spin-coating the non-planarized surface of polyimide 48 with this material. Then a thick second layer material, for example, positive diazo ketone novolac photoresist, is formed over the first and exposed without affecting the first layer and obtaining a blockout mask therefrom. When subjected to a heating step, the blockout material will wet out with the aid of the first material.

While the invention has been described in conjunction with specific preferred embodiments, it is evident that many alternatives, modifications and variations will be apparent to those skilled in the art in light of the foregoing description. It is therefore contemplated that the appended claims will embrace any such alternatives, modifications and variations as fall within the true scope and spirit of the invention.

What is claimed is:

1. A process for forming a planarized semiconductor structure comprising:
   providing a silicon substrate having on the surface thereof a low trench density region and a high trench density region;
   applying a dielectric polymer material to said substrate to fill the trenches in said high and low trench density regions and obtain a non-planar layer of said dielectric on said surface, said non-planarity being due to inherent forming of relatively thick and thin layers of said dielectric over said low and high trench density regions, respectively;
   forming a relatively thin conformal first layer of a fluidizable material on said dielectric;
   forming a relatively thick conformal second layer of said fluidizable material on said first layer; and
   removing said second layer from everywhere except in the regions in direct correspondence with the underlying trenches;
   heating said fluidizable material to permit the same to flow forming relatively thick and thin layers of said fluidizable material over said dielectric in correspondence with said low and high trench density regions, respectively, thereby exactly compensating for the difference in thickness between said thick and thin dielectric layers; and
   removing said fluidizable material and dielectric material on the surface of said substrate whereby said trenches are uniformly filled at the said surface.

2. The process as recited in claim 1 wherein said fluidizable material has the same etch rate as said dielectric material.

3. The process as recited in claim 1 wherein said fluidizable material is photoresist.

4. A process for forming a planarized semiconductor structure comprising:
   providing a silicon substrate having on the surface thereof a low trench density region and a high trench density region;
   applying a dielectric polymer material to said substrate to fill the trenches in said high and low trench density regions and obtain a non-planar layer of said dielectric on said surface, said non-planarity being due to inherent forming of relatively thick and thin layers of said dielectric over said low and high trench density regions, respectively;
   forming a relatively thick photoresist layer over said non-planar dielectric layer;
   controllably exposing said photoresist using a mask which is the complement of the mask used to define trenches in said high and low trench density regions to radiation to obtain a thick blockout in correspondence with each of said trenches and a thin wetting layer of said photoresist over the remainder of said dielectric layer;
   heating said fluidizable material to permit the same to flow forming relatively thick and thin layers of said fluidizable material over said dielectric in correspondence with said low and high trench density regions, respectively, thereby exactly compensating for the difference in thickness between said thick and thin dielectric layers; and
   removing said fluidizable material and dielectric material on the surface of said substrate whereby said trenches are uniformly filled at the said surface.

5. The process as recited in claim 4 wherein said polymer material is polyimide.

6. The process as recited in claim 5 wherein said applying step comprising:
   applying said polyimide over said substrate;
   heating to a first temperature to evaporate solvents in and provide a first curing for said polyimide; and
   heating to a second temperature to provide a second curing and cross-linking for said polyimide.

7. The process as recited in claim 4 wherein said removing step comprises reactive ion etching.

8. The process comprising:
   providing a silicon substrate;
   reactive ion etching said substrate by placing an apertured mask on said substrate to form a relatively large number of trenches in a first region of the substrate and a relatively small number of trenches in a second region of the substrate;
   applying a layer of polyimide to said substrate;
   heating said polyimide to enable it to flow and completely fill the trenches resulting, due to the relative difference in the trench-fill volume offered by the high and low trench density regions, in relatively thin and thick layers of polyimide over said high and low trench density regions, respectively;
   forming a relatively thick conformal photoresist layer over said polyimide;
   exposing the photoresist through a mask which is the inverse of said apertured mask to radiation of a predetermined dose for a predetermined time to obtain thick trench blockout mask sections on said polyimide in correspondence with each of the trenches thereunder and a thin layer of said photoresist over the remainder of the polyimide;
   heating the photoresist to a temperature to cause said blockout mask section to flow, with the aid of said thin photoresist layer, whereby said blockout sections corresponding to the high and low trench density regions coalesce into a first and second single mass, respectively, each of said masses having a substantially horizontal upper surface and exactly compensate for the difference in the thickness of the polyimide layer in the high and low trench density regions; and
   reactive ion etching until all of said photoresist and polyimide on the surface of said substrate is removed.

9. The process as recited in claim 8 wherein the thickness of said thick photoresist is in the range of 3–5 μm.

10. The process as recited in claim 8 wherein said the thickness of said thin photoresist layer is in the range 0.1–0.5 μm.

* * * * *